(12) United States Patent
Harwood

(10) Patent No.: US 7,038,127 B2
(45) Date of Patent: May 2, 2006

(54) UNIVERSAL MOUNTING ARRANGEMENT FOR COMPONENTS OF AN ELECTRONIC ENCLOSURE

(75) Inventor: Walter T. Harwood, Streamwood, IL (US)

(73) Assignee: Charles Industries, Ltd., Rolling Meadows, IL (US)

( * ) Notice: Subject to any disclaimer, the term of this patent is extended or adjusted under 35 U.S.C. 154(b) by 0 days.

(21) Appl. No.: 10/789,145

(22) Filed: Feb. 27, 2004

(65) Prior Publication Data

US 2005/0189133 A1   Sep. 1, 2005

(51) Int. Cl.
*H02G 3/08* (2006.01)

(52) U.S. Cl. .............................. 174/50; 174/37; 174/39; 174/60; 220/3.8; 312/351.2

(58) Field of Classification Search ................. 174/50, 174/53, 58, 57, 52.1, 59, 60, 37, 38, 39, 17 R; 312/351.2; 220/3.2, 3.3, 3.4, 3.5, 3.6, 3.7, 220/3.8, 4.02; 248/906; 361/664, 600, 602, 361/241
See application file for complete search history.

(56) References Cited

U.S. PATENT DOCUMENTS

| | | | | |
|---|---|---|---|---|
| 3,480,721 A | * | 11/1969 | Baumgartner | 174/38 |
| 3,538,236 A | * | 11/1970 | Baumgartner | 174/60 |
| 3,864,510 A | * | 2/1975 | Ramsey et al. | 174/38 |
| 4,631,353 A | * | 12/1986 | Marks | 174/38 |
| 5,384,427 A | | 1/1995 | Volk et al. | |
| 5,401,902 A | * | 3/1995 | Middlebrook et al. | 174/38 |
| D430,849 S | | 9/2000 | Leschinger et al. | |
| D436,101 S | | 1/2001 | McGovern et al. | |
| 6,182,846 B1 | | 2/2001 | Leschinger et al. | |
| 6,198,041 B1 | | 3/2001 | Leschinger et al. | |
| 6,244,635 B1 | | 6/2001 | Leschinger et al. | |
| 6,252,166 B1 | | 6/2001 | Leschinger | |
| 6,455,772 B1 | | 9/2002 | Leschinger et al. | |
| 6,462,269 B1 | | 10/2002 | Leschinger et al. | |
| 6,598,949 B1 | | 7/2003 | Frazier et al. | |
| 6,752,362 B1 | * | 6/2004 | Gretz | 248/156 |
| 2002/0096346 A1 | | 7/2002 | Maloney et al. | |

OTHER PUBLICATIONS

Marconi Network Components: ProFORM® Series Non-Metallic Pedestals product specification, Sep. 2003.

* cited by examiner

*Primary Examiner*—Angel R. Estrada
(74) *Attorney, Agent, or Firm*—Leydig, Voit & Mayer Ltd.

(57) ABSTRACT

A pedestal enclosure for electronic components is provided. The pedestal enclosure includes a base section and a cover engageable with the base section so as to define an interior space. The bracket system has at least two side rails. The pedestal enclosure further includes a mounting arrangement for releasably mounting a bracket system to the base section. The mounting arrangement includes a channel section at a lower end of each of the side rails of the bracket system and a mounting part supported on the base section. Each of the mounting parts is configured and arranged to be received in and engage a respective one of the channel sections. The mounting arrangement includes a manually releasable locking mechanism.

27 Claims, 7 Drawing Sheets

UNIVERSAL MOUNTING ARRANGEMENT FOR COMPONENTS OF AN ELECTRONIC ENCLOSURE

FIELD OF THE INVENTION

This invention pertains to electronic enclosures and, more particular, to a universal mounting arrangement for components of an electronics enclosure.

BACKGROUND OF THE INVENTION

Pedestal style electronics enclosures are used in telecommunications systems to house splices or terminal connections between service wires or distribution wires and buried telephone cables. Such pedestal enclosures can also be used to house connections to other types of buried utility cables such as for cable television or power distribution. Since pedestal enclosures are located outdoors, they must be substantially weather tight in order to protect the electronic connections from adverse environmental conditions such as wind, rain, snow and flooding. The pedestal enclosures also have to be relatively secure in order to guard against entry by unauthorized personnel and durable in order to withstand the wear-and-tear associated with being located in an outdoor environment.

Typically, a bracket system is provided on the interior of a pedestal enclosure to help arrange and support the cabling and various connections housed in the pedestal enclosure. The particular bracket system used depends on the application in which the pedestal is being employed, e.g., cable distribution, cross connect capability, fiber distribution or splice capability. These bracket systems can be mounted in the interior of the pedestal enclosure in a variety of different ways.

Unfortunately, the existing mounting arrangements for pedestal bracket systems pose a number of problems. For example, with many mounting arrangements, it can be difficult for a technician to insert and remove the bracket system in the field. Easy removal of the bracket system in the field is particularly important when performing maintenance or upgrading the equipment in a pedestal enclosure. Such work often can be facilitated by a complete change or retrofit of the bracket system. However, such a retrofit can be time consuming and difficult, if not impossible, with existing mounting arrangements.

BRIEF SUMMARY OF THE INVENTION

The invention provides a pedestal enclosure for electronic components. The pedestal enclosure includes a base section and a cover engageable with the base section so as to define an interior space. A bracket system is arranged in the interior space. The bracket system has at least two side rails. The pedestal enclosure further includes a mounting arrangement for releasably mounting the bracket system to the base section. The mounting arrangement includes a channel section at a lower end of each of the side rails of the bracket system and a mounting part supported on the base section. Each of the mounting parts is configured and arranged to be received in and engage a respective one of the channel sections. Each channel section is configured to capture the respective mounting part on at least four sides thereof and each mounting part includes a stop surface for engaging an end of the respective channel section. The mounting arrangement includes a manually releasable locking mechanism including a window in each of the channel sections and a flexible spring tab supported on each of the mounting parts. Each spring tab is engageable with a respective one of the channel section windows when the mounting parts are received in the channel sections.

The invention also provides a mounting arrangement for a bracket system of a pedestal enclosure. The mounting arrangement including a channel section arranged at a lower end of each of the side rails of the bracket system and a mounting part supported on the pedestal enclosure. Each of the mounting parts is configured and arranged to be received in and engage a respective one of the channel sections. Each channel section is configured to capture the respective mounting part on at least four sides thereof and each mounting part includes a stop surface for engaging an end of the respective channel section. The mounting arrangement further includes a manually releasable locking mechanism including a window in each of the channel sections and a flexible spring tab supported on each of the mounting parts. Each spring tab is engageable with a respective one of the channel section windows when the mounting parts are received in the channel sections.

DETAILED DESCRIPTION OF THE INVENTION

Figure 1:
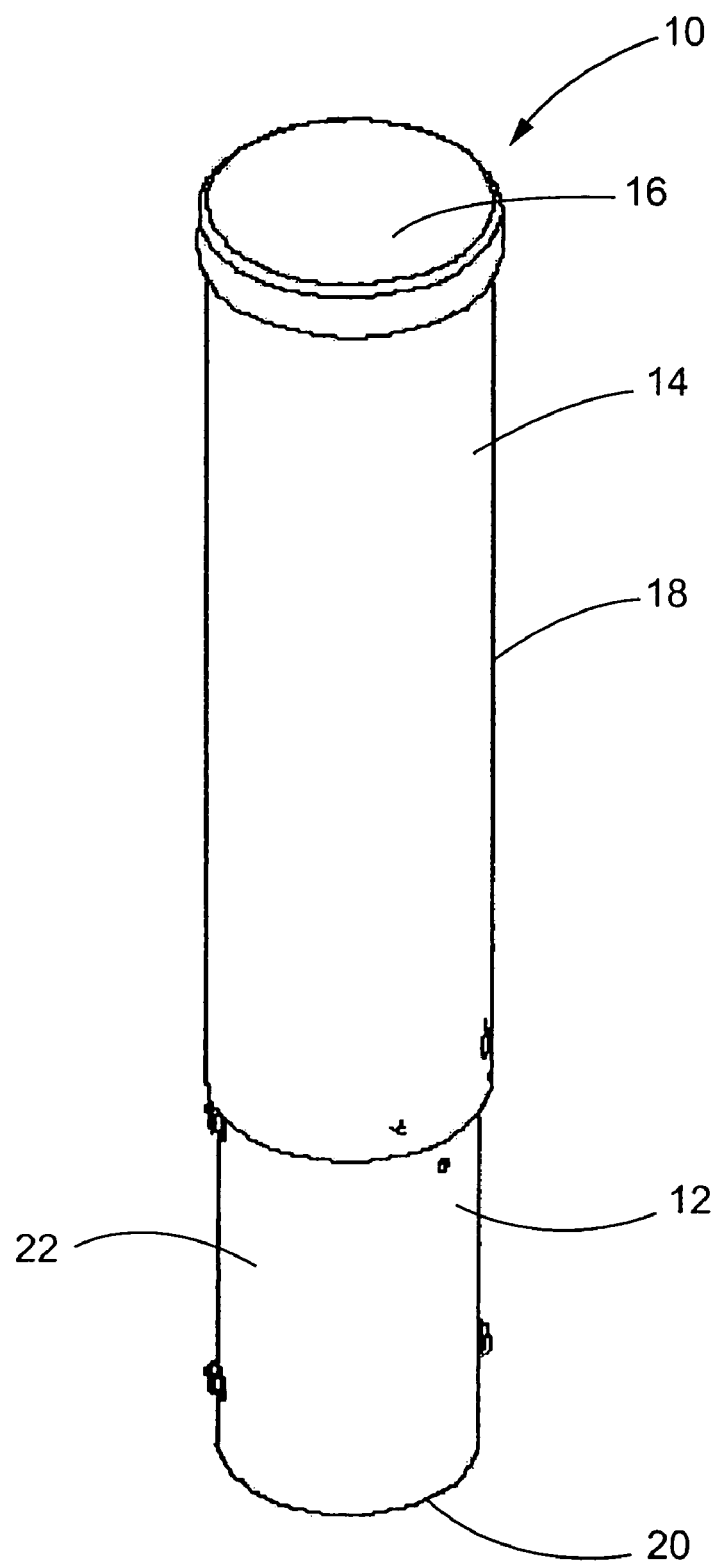
FIG. 1 is a perspective view of an illustrative pedestal enclosure according to the present invention.
Figure 2:
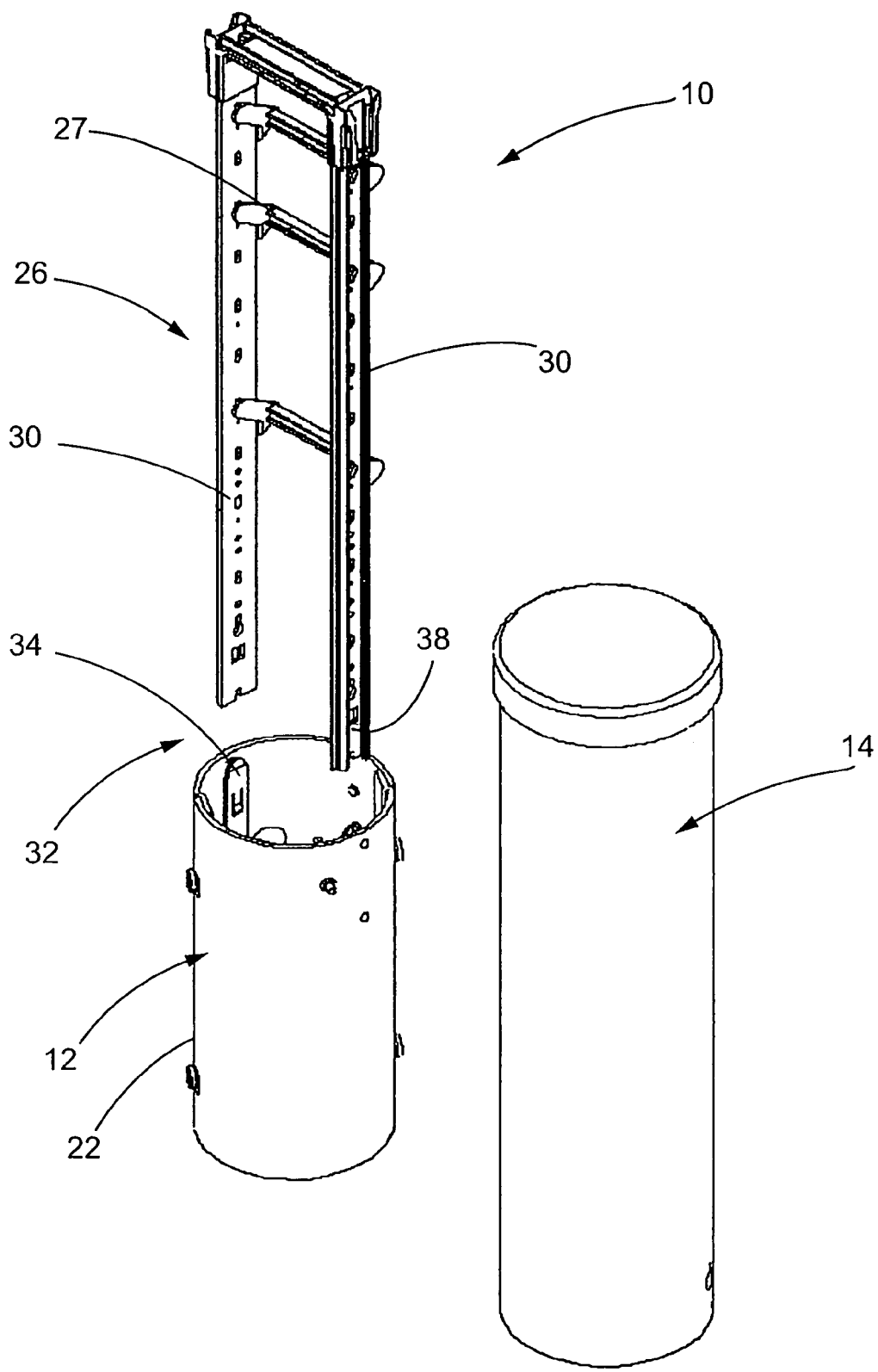
FIG. 2 is an exploded perspective view of the pedestal enclosure of FIG. 1.

Referring now to FIGS. 1 and 2 of the drawings, there is illustrated an exemplary pedestal enclosure 10 constructed in accordance with the teachings of the present invention. The illustrated pedestal enclosure 10 includes a base section 12 and a cover or dome 14. The cover 14 nests in a telescoping fashion over the base section 12 so as to define an interior space within the pedestal enclosure 10. This interior space can be used to house electronic equipment such as used in telecommunications, cable television or power transmission applications. The illustrated pedestal enclosure 10 is cylindrical in shape with both the cover 14 and the base section 12 including a respective end wall 16, 20 and a respective sidewall 18, 22. The cover 14 and base section 12 can be secured together by a lock mechanism. As will be appreciated by those skilled in the art, the present invention is not limited to any particular pedestal enclosure size or configuration. Moreover, while the present invention is discussed in the context of telecommunication systems, the present invention is not limited to a pedestal enclosure for housing any particular type of electronic component.

Figure 3:
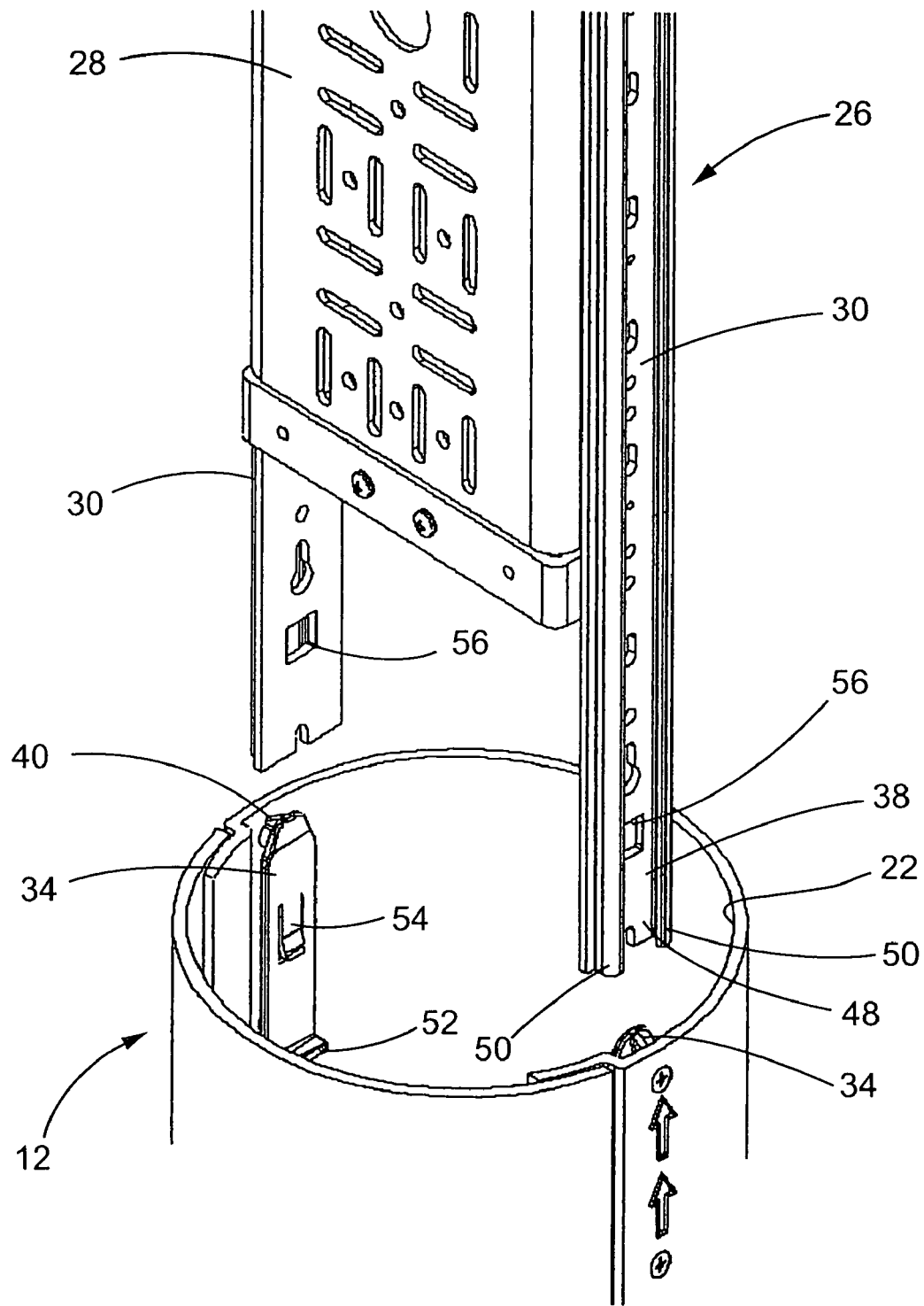
FIG. 3 is an enlarged partial perspective view of a base section and bracket system of a pedestal enclosure according to the present invention.

When in use, at least a portion of the base section 12 is typically filled with dirt and/or gravel and buried in the ground. Underground cables can be fed into the interior space of the pedestal enclosure 10 through an opening in the base section 12. To support the cabling, connections or other electronics housed in the pedestal enclosure 10, a bracket system 26 is provided. The bracket system can have a variety of different configurations as illustrated in the drawings. For example, the bracket system 26 illustrated in FIG. 2 includes a plurality of splice bars 27 extending between a pair of side rails 30. The bracket system illustrated in FIG. 3 includes a backboard 28 supported between a pair of side rails 30. The backboard 28 shown in FIG. 3 is generally planar in construction and has a plurality of openings formed therein. The side rails 30 extend along opposing edges of the backboard 28 and, in this case, extend to a point below a lower edge of the backboard.

For securing the bracket system 26 to the pedestal enclosure 10, a mounting arrangement 32 is provided which permits quick and easy mounting and removal of the bracket system to and from the pedestal enclosure (see FIG. 3). Specifically, in the case of the illustrated embodiment, the bracket system 26 is simply slid onto complementary mounting parts 34 provided on the pedestal and automatically locked in position. The bracket system 26 can be removed simply by manually releasing a locking mechanism from engagement with the bracket system.

Figure 7:
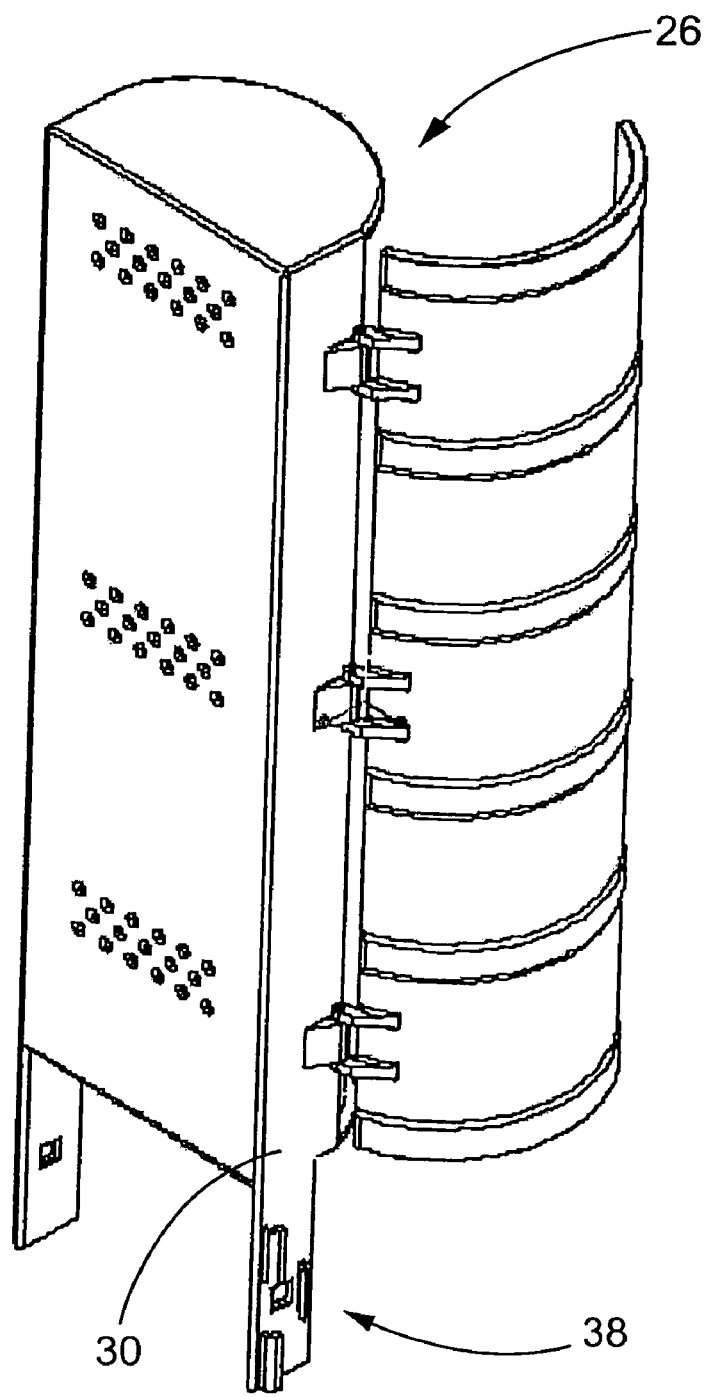
FIG. 7 is a perspective view of an alternative bracket system for a pedestal enclosure according to the present invention.

A further advantage of the mounting arrangement 32 of the present invention is that it can be universally applied to different pedestal and mounting bracket configurations. For example, a bracket system 26 having splice bars incorporating the present invention is shown in FIG. 2, a bracket system having a backboard incorporating the present invention is shown in FIG. 3 and a bracket system having a wire or fiber splice closure that incorporates the present invention is illustrated in FIG. 7. This universal application is accomplished, in part, by standardizing the interface between the bracket system 26 and the pedestal enclosure 10 so that similarly configured mounting elements are used on a variety of different pedestal enclosure and bracket system styles. As will be appreciated, this affords much more flexibility with regard to upgrading or changing out the pedestal enclosure 10 once it has been installed in the field. In particular, the old bracket system can simply be removed and replaced with a new bracket system without requiring any change in the bracket system mounting hardware. The standardized configurations of the mounting elements also help reduce the costs associated with manufacturing pedestals and bracket systems having different configurations.

Figure 5:
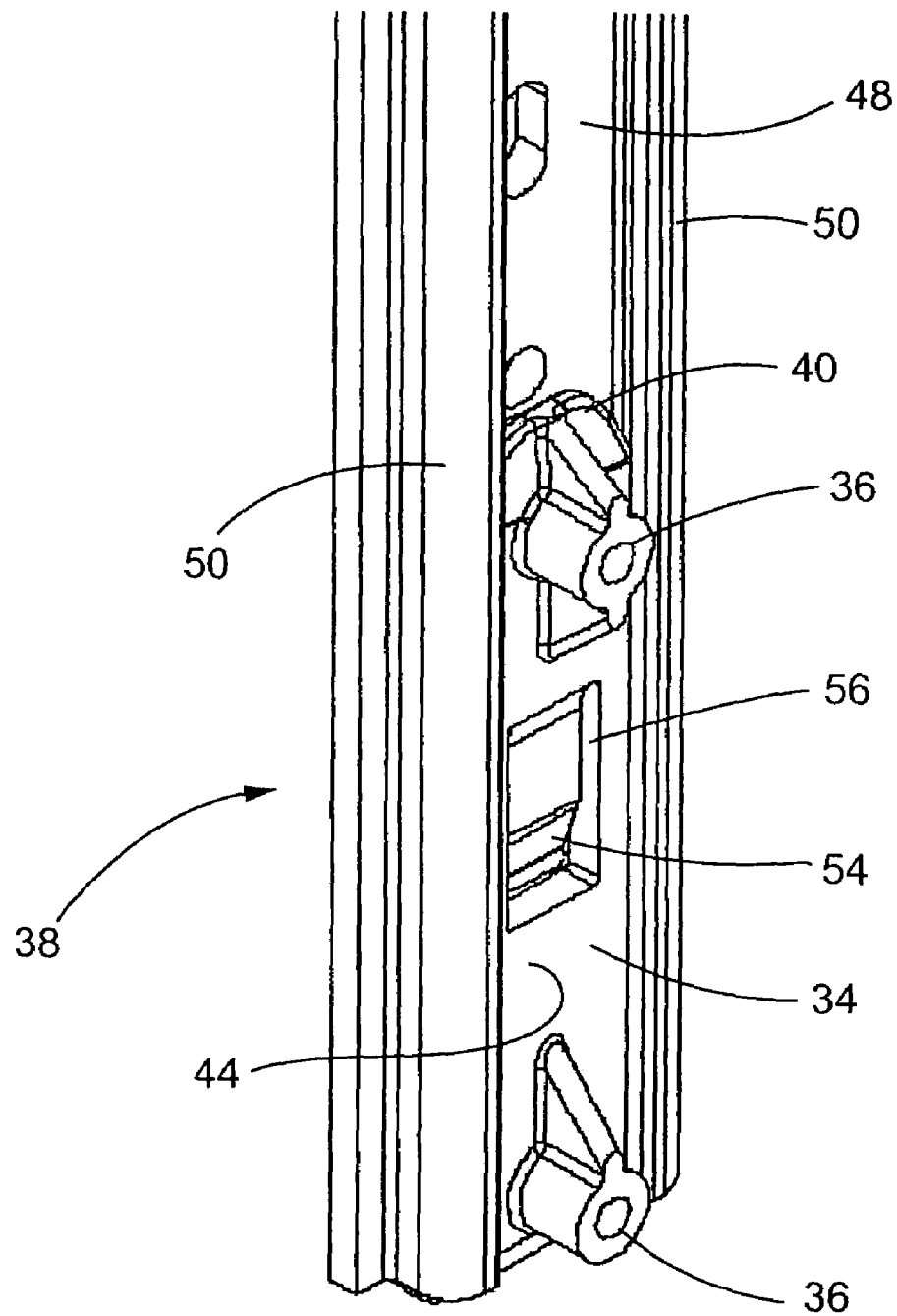
FIG. 5 is an enlarged perspective view showing one of the mounting parts engaged with one of the channel sections on the side rails of the pedestal enclosure of FIG. 3.

In the illustrated embodiment, two mounting parts 34 are provided on the base section 12 of the pedestal enclosure 10 (see FIG. 3). The two mounting parts 34 are arranged opposite each other on the inside of the sidewall 22 of the base section 12 and are spaced from one another such that each can engage a respective one of the side rails 30. In other embodiments, additional mounting parts 34 can be provided. For example, three mounting parts 34 could be provided in the base section 12 to accommodate bracket systems having three side rails or legs. The mounting parts 34 can be supported on the base section 12 in any suitable manner including, for example, attachment via screws, rivets or snap elements or be molded into the base. Each mounting part 34, in this case, includes a pair of mounting holes 36 (see FIG. 5) that can receive fasteners inserted through base section 12 from the exterior thereof. To enable the mounting arrangement 32 to be installed in existing pedestal enclosures already in the field, these mounting holes 36 can be arranged relative to one another such that they will line up with the holes already provided in existing pedestal enclosures for conventional bracket system mounting arrangements.

Figure 4:
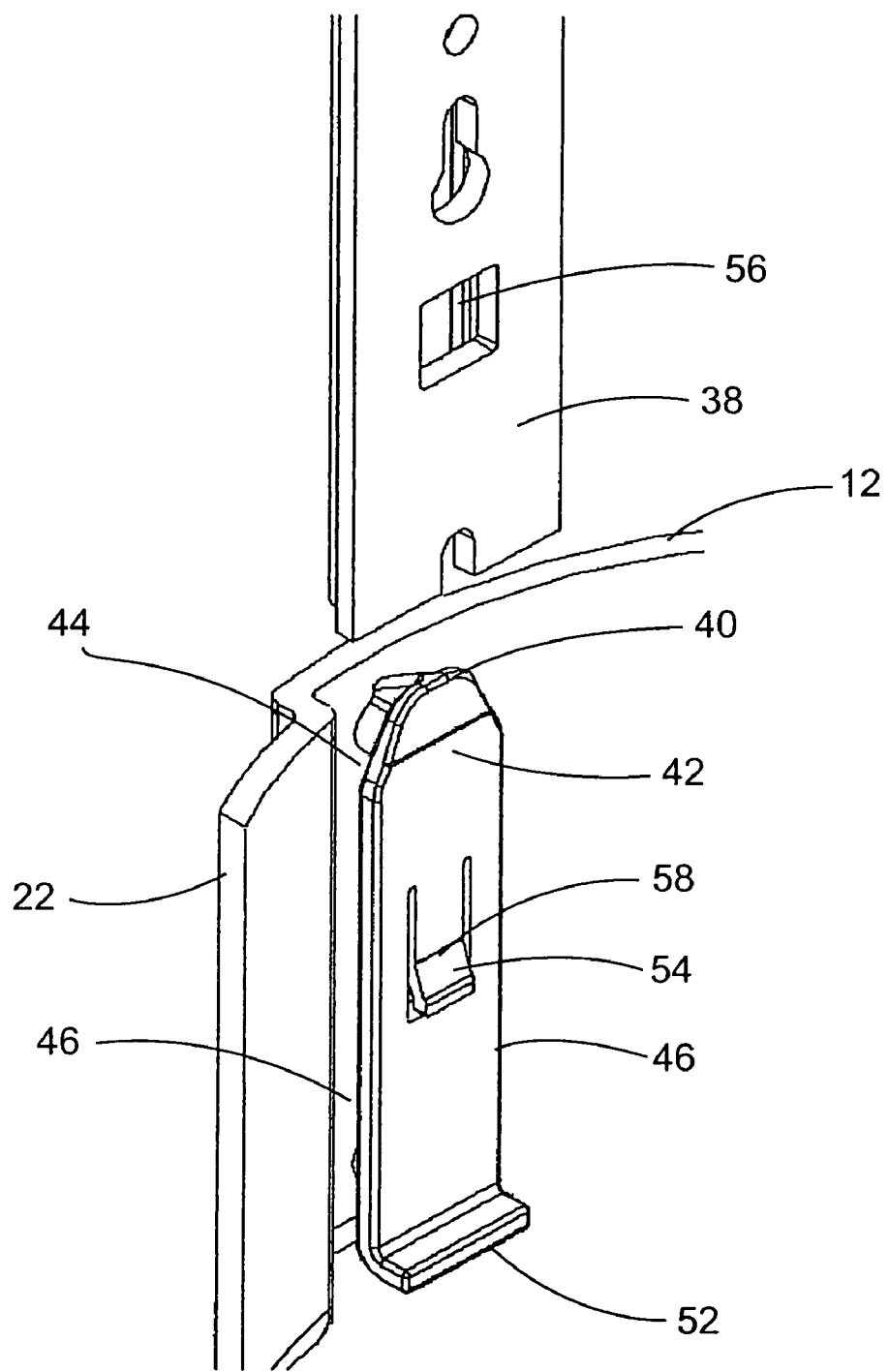
FIG. 4 is an enlarged perspective view showing one of the side rails and mounting parts of the pedestal enclosure of FIG. 3.

As best shown in FIG. 4, each of the mounting parts 34 has, in this instance, a generally elongated and relatively narrow configuration. More specifically, the illustrated mounting parts 34 are configured to be received in a channel section 38 provided at the lower end of the each of the side rails 30 of the bracket system 26. With such an arrangement, the bracket system 26 can be installed in the pedestal enclosure 10 by lowering the side rails 30 into engagement with the mounting parts 34. When the mounting parts 34 engage the side rails 30, the mounting parts slide into and are thereby captured by the channel sections 38 (see FIG. 5). To facilitate engagement of the mounting parts 34 with the channel sections 38 of the side rails, the upper or leading end 40 of each of the mounting parts 34 is tapered with the sides of the mounting part angling outward as they extend down from the upper edge of the mounting part.

Each channel section 38 is configured to engage and capture the respective mounting part 34 on at least four sides (i.e., the inner and outer faces 42, 44 and two lateral sides 46 of the mounting part—see FIG. 4). In particular, each channel section has, in this case, a solid back wall 48 from which generally L-shaped sidewalls 50 extend (see FIGS. 3 and 5). Each of the L-shaped sidewalls 50 has a first section that extends perpendicular to the back wall 48 of the channel section 38 and a second section that extends perpendicular to the first sidewall section and parallel to the back wall of the channel section. When the mounting part 34 is received in the channel section 38, the back wall 48 of the channel section abuts or engages the outer face 44 of the mounting part 34. Similarly, the L-shaped sidewalls 50 of the channel section 38 abut or engage the sides 46 as well as the inner face 42 of the mounting part 34. Thus, the engagement of the mounting part 34 with the channel section 38 prevents any lateral movement of the bracket system 26 relative to the mounting part 34 and, in turn, the base section 12. To prevent further downward sliding of the side rails 30 over the mounting parts 34 once the mounting parts are engaged with the channel sections 38, a stop surface 52 is provided on the lower end of each of the mounting parts 34. This stop surface 52 engages the lower edge of the channel section 38 of the respective side rails 30 and prevents further downward movement of the side rails relative to the mounting parts and the base section.

Figure 6:
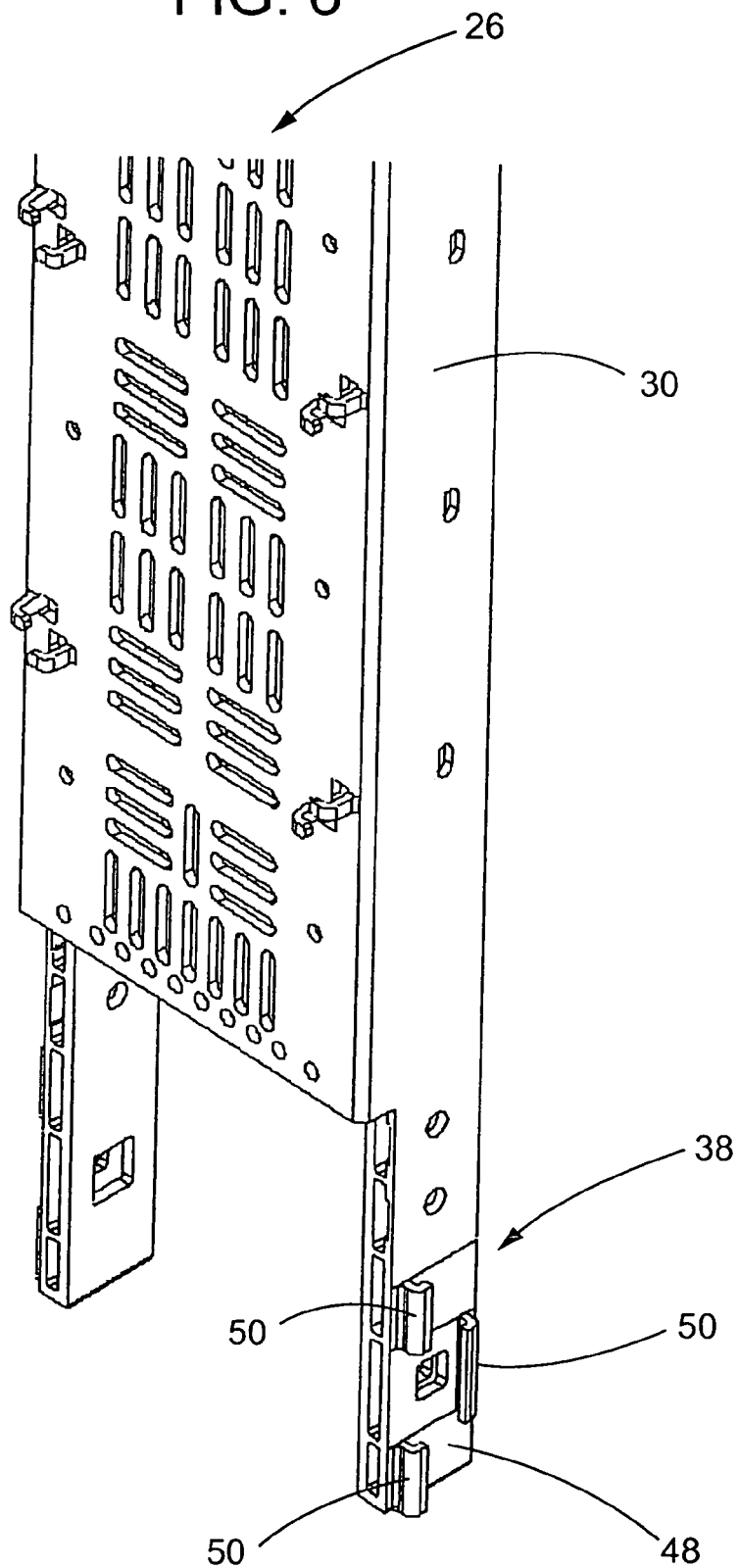
FIG. 6 is a perspective view of a bracket system for a pedestal enclosure according to the present invention having a side rail channel section with an alternative configuration.

In the embodiments illustrated in FIGS. 2 and 3, each of the channel sections 38 defines a continuous channel that extends the entire length of the respective side rail 30. An alternative embodiment in which the channel sections 38 are only provided at the lower ends of the side rails 30 is illustrated in FIG. 6. In this embodiment, each of the channel sections 38 defines only a partial channel. In particular, the L-shaped sidewalls 50 of the channel sections 38 are only provided adjacent the lower ends of the side rails 30. Moreover, the L-shaped sidewalls 50 are configured so that they do not engage the entire length of the sides 46 of the mounting parts 34 when the mounting parts are engaged with the channel sections. Instead, in the illustrated embodiment, one of the L-shaped sidewalls 50 will engage only a center section of one of the sides of the mounting part 34 while the other L-shaped sidewall 50 has a split configuration that provides for engagement near the upper and lower ends of the other side of the mounting part 34. As will be appreciated, the channel section can have any desired configuration so long as it provides sufficient support to prevent lateral movement of the bracket system relative to the mounting parts and the base section.

In order to prevent unintentional removal of the bracket system 26 once the channel sections 38 are engaged with the mounting parts 34, the mounting arrangement 32 includes a locking mechanism. In the illustrated embodiment, the locking mechanism has a snap-action that automatically engages the locking mechanism when the channel sections 38 are engaged with the mounting parts 34. Moreover, the locking mechanism is manually releasable so as to allow a technician to disengage the locking mechanism and remove the bracket system 26 as desired. The locking mechanism, in this case, includes a spring tab 54 on each of the mounting parts 34 that engages a corresponding window 56 in the back wall 48 of the respective channel section 38 when the channel sections are slid over the mounting parts (see FIGS. 3–5).

In its normal position, the spring tab 54 protrudes slightly from the outer face 42 of the mounting part 34. A ramped section 58 is provided on the spring tab 54 that facilitates inward deflection of the spring tab 54 as the channel section 38 slides downward over the mounting part 34. When the window 56 in the back wall 48 of the channel section 38 reaches the spring tab 54, the tab springs back outward and engages the window. The engagement of the spring tab 54 with the window 56, specifically the lower edge of the window 56, prevents the side rails 30 from being lifted off the mounting parts 34. To release the locking mechanism, a technician simply has to push inward on the spring tab 54 through the window 56 until the spring tab moves out of engagement with the window. The technician can then lift the side rails 30 off the mounting parts 34.

From the foregoing, those skilled in the art will appreciate that the present invention allows a bracket system to be quickly and easily mounted to and removed from a pedestal enclosure. The mounting arrangement of the present invention is also extremely flexible in use. For example, it can be retrofitted onto existing pedestal enclosures. Moreover, the mounting arrangement can be used with a wide variety of different pedestal enclosure configurations such as pedestal enclosures having unitary square base sections, split square base sections, unitary and split round base sections, and square base sections with round covers. The mounting arrangement can also be used with a wide variety of different pedestal bracket systems including internal splice bracket systems, universal backboard bracket systems and bracket systems having a wire or fiber spice closure.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A pedestal enclosure for electronic components, the enclosure comprising:
   a base section;
   a cover engageable with the base section so as to define an interior space;
   a bracket system arranged in the interior space, the bracket system having at least two side rails; and
   a mounting arrangement for releasably mounting the bracket system to the base section, the mounting arrangement including a channel section at a lower end of each of the side rails of the bracket system and a mounting part supported on the base section, each of the mounting parts being configured and arranged to be received in and engage a respective one of the channel sections, each channel section being configured to capture the respective mounting part on at least four sides thereof;
   wherein the mounting arrangement includes a manually releasable locking mechanism including a window in each of the channel sections and a flexible spring tab supported on each of the mounting parts, each spring tab being engageable with a respective one of the channel section windows when the mounting parts are received in the channel sections.

2. The pedestal enclosure of claim 1 wherein each channel section has a pair of L-shaped sidewalls extending from a back wall.

3. The pedestal enclosure of claim 2 wherein the L-shaped sidewalls extend the entire length of the corresponding side rail.

4. The pedestal enclosure of claim 2 wherein the L-shaped sidewalls extend a limited distance along the corresponding side rail.

5. The pedestal enclosure of claim 4 wherein at least one of the L-shaped side walls has a split configuration.

6. The pedestal enclosure of claim 1 wherein each channel section extends the entire length of the corresponding side rail.

7. The pedestal enclosure of claim 1 wherein each channel section extends a limited distance along the corresponding side rail.

8. The pedestal enclosure of claim 1 wherein each mounting part includes a stop surface for engaging an end of the corresponding channel section.

9. The pedestal enclosure of claim 1 wherein each mounting part includes mounting holes for connecting the respective mounting part to the base section with fasteners.

10. The pedestal enclosure of claim 9 wherein the mounting holes in the mounting part are spaced from each other a distance corresponding to the distance between mounting holes provided in the base section for receiving other mounting hardware.

11. The pedestal enclosure of claim 1 wherein a leading edge of each of the mounting parts is tapered.

12. The pedestal enclosure of claim 1 wherein the spring tab includes a ramped section to facilitate deflection of the spring tab when the channel sections are brought into engagement with the mounting parts.

13. The pedestal enclosure of claim 1 wherein the bracket system includes splice bars extending between the side rails.

14. The pedestal enclosure of claim 1 wherein the bracket system includes a backboard extending between the side rails.

15. The pedestal enclosure of claim 1 wherein the bracket system includes a wire splice closure.

16. A mounting arrangement for a bracket system of a pedestal enclosure, the bracket system having at least two side rails, the mounting arrangement comprising:
 a channel section arranged at a lower end of each of the side rails of the bracket system;
 a mounting part supported on the pedestal enclosure, each of the mounting parts being configured and arranged to be received in and engage a respective one of the channel sections, each channel section being configured to capture the respective mounting part on at least four sides thereof;
 a manually releasable locking mechanism including a window in each of the channel sections and a flexible spring tab supported on each of the mounting parts, each spring tab being engageable with a respective one of the channel section windows when the mounting parts are received in the channel sections.

17. The mounting arrangement of claim 16 wherein each channel section has a pair of L-shaped sidewalls extending from a back wall.

18. The mounting arrangement of claim 17 wherein the L-shaped sidewalls extend the entire length of the corresponding side rail.

19. The mounting arrangement of claim 17 wherein the L-shaped sidewalls extend a limited distance along the corresponding side rail.

20. The mounting arrangement of claim 19 wherein at least one of the L-shaped side walls has a split configuration.

21. The mounting arrangement of claim 16 wherein each channel section extends the entire length of the corresponding side rail.

22. The mounting arrangement of claim 16 wherein each channel section extends a limited distance along the corresponding side rail.

23. The mounting arrangement of claim 16 wherein each mounting part includes a stop surface for engaging an end of the corresponding channel section.

24. The mounting arrangement of claim 16 wherein each mounting part includes mounting holes for connecting the respective mounting part to the base section with fasteners.

25. The mounting arrangement of claim 24 wherein the mounting holes in the mounting part are spaced from each other a distance corresponding to the distance between mounting holes provided in the base section for receiving other mounting hardware.

26. The mounting arrangement of claim 16 wherein a leading edge of each of the mounting parts is tapered.

27. The mounting arrangement of claim 16 wherein the spring tab includes a ramped section to facilitate deflection of the spring tab when the channel sections are brought into engagement with the mounting parts.

* * * * *